US012684750B2

(12) United States Patent
Cho et al.

(10) Patent No.: US 12,684,750 B2
(45) Date of Patent: Jul. 14, 2026

(54) COMPOSITE MATERIAL SELF-WRAP SHIELDING TUBE

(71) Applicant: LS CABLE & SYSTEM LTD., Anyang-si (KR)

(72) Inventors: Chang Eun Cho, Suwon-si (KR); Un Kyoo Park, Songpa-gu (KR)

(73) Assignee: LS CABLE & SYSTEM LTD., Anyang-si (KR)

( * ) Notice: Subject to any disclaimer, the term of this patent is extended or adjusted under 35 U.S.C. 154(b) by 405 days.

(21) Appl. No.: 18/286,515

(22) PCT Filed: Apr. 25, 2022

(86) PCT No.: PCT/KR2022/005854
§ 371 (c)(1),
(2) Date: May 8, 2024

(87) PCT Pub. No.: WO2022/234992
PCT Pub. Date: Nov. 10, 2022

(65) Prior Publication Data
US 2025/0185226 A1 Jun. 5, 2025

(30) Foreign Application Priority Data

May 4, 2021 (KR) ......................... 10-2021-0058072
Apr. 22, 2022 (KR) ......................... 10-2022-0049869

(51) Int. Cl.
H05K 9/00 (2006.01)
(52) U.S. Cl.
CPC ................................... H05K 9/009 (2013.01)

(58) Field of Classification Search
CPC ......... H05K 9/009; H05K 9/0098; H05K 9/00
See application file for complete search history.

(56) References Cited

U.S. PATENT DOCUMENTS 4,684,762 A * 8/1987 Gladfelter .............. D03D 15/00
174/DIG. 11
2014/0262476 A1* 9/2014 Laurent .................. D03D 15/47
174/379

FOREIGN PATENT DOCUMENTS

JP 2011179162 A 9/2011
JP 2016512580 A 4/2016
KR 20150047558 A 5/2015
(Continued)

OTHER PUBLICATIONS

International Search Report for related International Application No. PCT/KR2022/005854; action dated Nov. 10, 2022; (3 pages).
(Continued)

*Primary Examiner* — Timothy J Thompson
*Assistant Examiner* — Amol H Patel
(74) *Attorney, Agent, or Firm* — K&L Gates LLP

(57) ABSTRACT

A composite material self-wrap shielding tube includes: a plurality of carbon fiber bundles disposed extending in a longitudinal direction; a plurality of wire bundles alternately disposed with the carbon fiber bundles and composed of metal wires; and a plurality of weft yarns disposed extending in a direction perpendicular to the carbon fiber bundles and the wire bundles. The composite material self-wrap shielding tube is formed by winding, into a cylindrical shape, a braided member made by braiding the carbon fiber bundles, the wire bundles, and the weft yarns.

15 Claims, 10 Drawing Sheets

(56)  References Cited

FOREIGN PATENT DOCUMENTS

| | | | | |
|---|---|---|---|---|
| KR | 20170021783 A | | 2/2017 | |
| KR | 20200028122 A | * | 3/2020 | ............... H01B 5/12 |
| KR | 20200063040 A | | 6/2020 | |

OTHER PUBLICATIONS

Written Opinion for related International Application No. PCT/KR2022/005854; action dated Nov. 10, 2022; (4 pages).
Office Action issued in corresponding related Japanese Application No. 2023-559855; action dated Nov. 8, 2024; (4 pages).

\* cited by examiner

COMPOSITE MATERIAL SELF-WRAP SHIELDING TUBE

CROSS-REFERENCE TO RELATED APPLICATIONS

The present application is a National Stage of International Application No. PCT/KR2022/005854 filed on Apr. 25, 2022, which claims the benefit of Korean Patent Application No. 10-2021-0058072, filed on May 4, 2021, and Korean Patent Application No. 10-2022-0049869, filed on Apr. 22, 2022 with the Korean Intellectual Property Office, the entire contents of which are hereby incorporated by reference.

FIELD

The present disclosure relates to a composite material self-wrap shielding tube, and more specifically, to a composite material self-wrap shielding tube that improves the workability of cable connection or cable shielding work and minimizes weight and cost while ensuring good electromagnetic wave shielding performance.

BACKGROUND

Conventional tubular shielding fabrics were manufactured by being composed of only one of either conductive fiber or conductive metal material. In the case of tubular shielding fabrics using conductive fibers, the shielding properties were insufficient, so the tubular shielding fabrics were manufactured by increasing the conductivity through additional covering of metal foil instead of a single-layer structure or plating or other surface treatment methods on the fiber itself to compensate therefor, or by using only conductive metal materials.

As mentioned above, in the case of conductive fibers, the conductivity of the fiber, which determines the shielding properties, is relatively insufficient compared to metal materials, and additional measures are taken on the fiber to compensate for the insufficient shielding performance. In this connection, due to these measures, there is a risk that the flame retardancy of the entire tube may be reduced or that separation and peeling of plating and coating materials may occur during a manufacturing process or during handling of the tube after manufacturing, and that this may cause unevenness in shielding properties by section.

When a multi-layer structure is applied to compensate therefor, the properties of the metal foil layer become stronger than those of the tube, so this also increases the inconvenience in handling of the tube.

On the other hand, in the case of a tubular product manufactured only of metal materials, like a multi-layered tube including metal foil, the base material for processing into a tube form rather than a fabric is a metal alloy in the form of a wire, so fabrics manufactured of fiber are stiff and inconvenient to handle in the form of a tube.

In addition, because the weight is relatively increased compared to a tube of a fiber material, it is difficult to apply to various fields that require lightweight products.

SUMMARY

A technical task of the present disclosure has been devised to obviate the above limitation. An aspect of the present disclosure is directed to providing a composite material self-wrap shielding tube that improves the workability of cable connection or cable shielding work and minimizes weight and cost while ensuring good electromagnetic wave shielding performance.

The composite material self-wrap shielding tube according to an embodiment of the present disclosure includes: a plurality of carbon fiber bundles disposed extending in a first direction; a plurality of wire bundles extending in the first direction parallel to the carbon fiber bundles and alternately disposed therewith, and composed of metal wires; and a plurality of weft yarns disposed extending in a second direction perpendicular to the first direction. The composite material self-wrap shielding tube is formed by winding, into a cylindrical shape, a braided member made by braiding the carbon fiber bundles, the wire bundles, and the weft yarns.

In an embodiment of the present disclosure, a ratio of the number of carbon fiber bundles to the number of wire bundles disposed may be 1:n (where n is a natural number of 8 or less). Alternatively, a total area of the wire bundle may be 1 to 8 times a total area of the carbon fiber bundle.

In an embodiment of the present disclosure, the carbon fiber bundle may be composed of 3 k strands, 6 k strands, or 12 k strands of carbon fiber yarn.

In an embodiment of the present disclosure, the carbon fiber yarn configuring the carbon fiber bundle may be coated with polyamide.

In an embodiment of the present disclosure, a metal wire configuring the wire bundle may be made of CCA (Copper Clad Aluminum).

In an embodiment of the present disclosure, the metal wire configuring the wire bundle may be formed of a mixed material of silicon (Si), iron (Fe), copper (Cu), manganese (Mn), magnesium (Mg), chromium (Cr), and zinc (Zn) with aluminum (Al).

In an embodiment of the present disclosure, the composite material self-wrap shielding tube may have a shielding ratio (dB) of 40 dB or more under a signal condition of 100 MHz.

In an embodiment of the present disclosure, a ratio of the number of carbon fiber bundles to the number of wire bundles disposed may be 1:n (where n is a natural number of 32 or less), and the carbon fiber bundle may be configured of 3 k strands of carbon fiber yarn. Alternatively, the total area of the wire bundle may be 1 to 32 times the total area of the carbon fiber bundle.

In an embodiment of the present disclosure, a ratio of the number of carbon fiber bundles to the number of wire bundles disposed may be 1:n (where n is a natural number of 16 or less), and the carbon fiber bundle may be configured of 6 k strands of carbon fiber yarn. Alternatively, the total area of the wire bundle may be 1 to 16 times the total area of the carbon fiber bundle.

In an embodiment of the present disclosure, a ratio of the number of carbon fiber bundles to the number of wire bundles disposed may be 1:n (where n is a natural number of 8 or less), and the carbon fiber bundle may be configured of 12 k strands of carbon fiber yarn. Alternatively, the total area of the wire bundle may be 1 to 8 times of the carbon fiber bundle.

In an embodiment of the present disclosure, when the braided member is wound into a cylindrical shape, an overlapping portion may be formed where ends of the braided member overlap in a circumferential direction of the cylindrically wound braided member.

In an embodiment of the present disclosure, the overlapping portion may include a first overlapping portion formed at a first end and a second overlapping portion formed at a second end opposite the first end.

In an embodiment of the present disclosure, areas of the first overlapping portion and the second overlapping portion may each be ⅛ to ⅓ of an area of the braided member in the second direction.

In an embodiment of the present disclosure, in the first overlapping portion and the second overlapping portion, a total area of the wire bundle may be ⅓ to ⅘ of a total area of the carbon fiber bundle.

In an embodiment of the present disclosure, the braided member includes a non-overlapping portion disposed between the first overlapping portion and the second overlapping portion, wherein a ratio of the number of carbon fiber bundles to the number of wire bundles disposed in the non-overlapping portion is 1:n (where n is a natural number of 8 or less). When the carbon fiber bundle and the wire bundle in the non-overlapping portion are repeatedly disposed m times at a ratio of 1:n, a ratio of the number of the carbon fiber bundles to the number of wire bundles disposed in the first overlapping portion and the second overlapping portion is (n+2):n. The first overlapping portion and the second overlapping portion may be disposed by repeating the carbon fiber bundle and the wire bundle m/2 times at a ratio of (n+2):n.

In an embodiment of the present disclosure, the braided member includes a non-overlapping portion disposed between the first overlapping portion and the second overlapping portion, wherein a ratio of the number of the carbon fiber bundles to the number of wire bundles disposed in the non-overlapping portion is 1:n (where n is a natural number of 8 or less), a ratio of the number of the carbon fiber bundles to the number of wire bundles disposed in the first overlapping portion is 1:n (where n is a natural number of 8 or less), and a ratio of the number of the carbon fiber bundles to the number of wire bundles disposed in the second overlapping portion is 1:n (where n is a natural number of 8 or less).

According to an embodiment of the present disclosure, by disposing two different warp yarn materials alternately at a predetermined ratio, a composite material self-wrap shielding tube according to an embodiment of the present disclosure can improve the workability of cable connection or cable shielding work and minimize weight and cost while ensuring good electromagnetic wave shielding performance.

DETAILED DESCRIPTION

Figure 1:
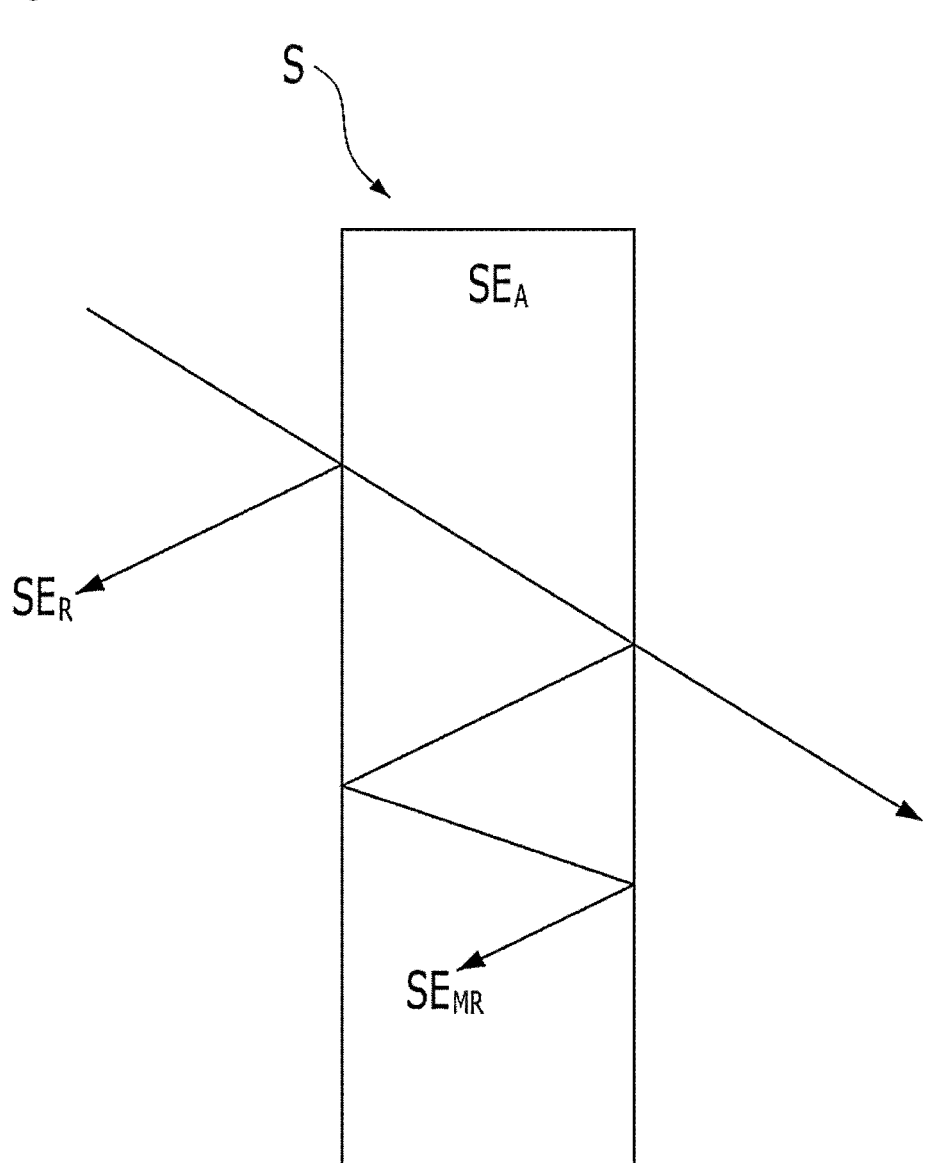
FIG. 1 is a conceptual diagram illustrating electromagnetic wave shielding properties of a shielding material.

The present disclosure may be subject to various changes and may have various forms, and embodiments will be described in detail. However, this is not intended to limit the present disclosure to a specific disclosed form, and should be understood to include all changes, equivalents, and substitutes included in the spirit and technical scope of the present disclosure. Like reference numerals in each drawing designate like constituents. It will be understood that although the terms first, second, etc. may be used to describe various constituents, these constituents should not be limited by these terms.

These terms are used only to distinguish one constituent from another constituent. The terms used herein are merely used to describe specific embodiments and are not intended to limit the present disclosure. A singular expression includes a plural expression, unless the context clearly states otherwise.

In the present specification, it should be understood that the terms such as "include" or "have" are merely intended to indicate that features, numbers, steps, operations, constituents, parts, or combinations thereof are present, and are not intended to exclude the possibility that one or more other features, numbers, steps, operations, constituents, parts, or combinations thereof will be present or added.

Unless otherwise defined, all technical and scientific terms used in the embodiments have the same meanings as commonly understood by a skilled expert in the technical field to which the present disclosure belongs. It will be further understood that terms, such as those defined in commonly used dictionaries, should be interpreted as having a meaning that is consistent with their meanings of the context of the relevant art and the present disclosure, and will not be interpreted in an idealized or overly formal sense unless expressly so defined herein.

Hereinafter, preferred embodiments of the present disclosure will be described in more detail with reference to the drawings.

FIG. 1 is a conceptual diagram illustrating electromagnetic wave shielding properties of a shielding material.

In general, the principle by which a shielding material S shields electromagnetic waves is that, as shown in FIG. 1, the shielding material S absorbs (SEA) a portion of the radiated electromagnetic waves inside the shielding material S, reflects (SER) a portion thereof from the surface of the shielding material S, or reflects (SEMR) the rest multiple times inside the shielding material, thereby minimizing the size of the electromagnetic waves that pass through the shielding material S and propagate outward.

In addition, the measure by which electromagnetic waves transmitted inside the shielding material S are quickly extinguished is related to the length that the electromagnetic waves travel inside the shielding material S, and is a concept related to the length of time the electromagnetic waves propagate inside the shielding material S. The concept "skin depth δ" related to the length of propagation of electromagnetic waves inside the shielding material S refers to the length of propagation of electromagnetic waves until the intensity of electromagnetic waves introduced into a specific shielding material S is attenuated to 1/e, and is known as Equation 1 below.

$$\delta = \sqrt{\frac{2}{\mu_0 \times \omega \times \sigma}}$$  Equation 1

Herein, $\mu_0$ represents the permeability in free space, $\omega$ represents the electromagnetic wave frequency, and $\sigma$ represents the electrical conductivity of the shielding material S.

The high electromagnetic wave shielding performance of a specific shielding material S ultimately means that the size of the skin depth δ described in Equation 1 above is small. Accordingly, it may be seen that in order to increase the electromagnetic wave shielding performance of a shielding material, the shielding material needs to be composed of the shielding material S with a small skin depth δ. In order to reduce the skin depth δ through Equation 1 above, it may be seen that a material with high electrical conductivity needs to be used. In other words, in the case of shielding tubes, it may be seen that the electrical conductivity of a material determines the shielding performance of a product.

Various technologies have been applied in the past to increase electrical conductivity. However, there are limitations in each of these cases. When coating is performed to increase the electrical conductivity of the fiber, a highly conductive metal-based coating is used. In this connection, the resins for the coating causes a decrease in the flame retardant performance of the tube in the future.

Even when plating rather than resin coating is used, the plated metal may peel and fall off during a product manufacturing process or during subsequent handling even after the product is manufactured, and thus there is difficulty in installation, use, and handling. In addition, also in terms of performance, it is difficult to secure uniform shielding performance throughout the tube.

In addition, even when supplemented by wrapping a metal foil with a second layer, the tube's stability and lightness are not good, and even when finishing during installation, it is not finished neatly. This is because a metal foil layer does not adhere tightly enough to the internal wire, which causes the tube to open. Accordingly, it is difficult to finish just with the restoring force of the tube itself, and in most cases, additional taping or equivalent finishing work is required after installation.

Conversely, even in the case of shielding tubes composed only of metal materials, different issues arise when manufactured as shielding tubes. In general, most materials manufactured in the form of tubes are fibers, so when metal warps are used for shielding, the tube itself tends to be heavier than the fibers.

In addition, when commercialized, the restoring force as a self-curling, self-wrap tube (the force to re-curled when the curled part of the tube is opened and left) is either too strong or, unlike regular fiber tubes, in many cases it is extreme and does not open easily during installation. Accordingly, work difficulties may arise when trying to wrap electric wires.

In addition, also when the weft yarn is woven with metal, the metal sticks out during the thermoforming process to form a self-wrap tube, causing appearance issues, so in most cases, there is no choice but to use fiber as the weft yarn. Accordingly, in this connection, since the stiffness of the weft yarn is relatively low compared to the warp yarn, it is difficult to manufacture a consistent appearance of the entire tube.

In addition, as the size of a product increases, depending on the configuration of the warp yarn and weft yarn, the arrangement of the ply yarns of the warp yarn itself becomes disturbed during the thermoforming process. Even when it is manufactured with a certain spacing and form during weaving, the tube is subjected to local forces in different directions during the product stage. Accordingly, there are cases where the finished product is curved or uneven, and the level of difficulty in controlling the same through process methods is quite high.

However, by disposing two different warp yarn materials, a composite material self-wrap shielding tube according to an embodiment of the present disclosure can improve the workability of cable connection or cable shielding work and minimize weight and cost while ensuring good electromagnetic wave shielding performance.

Figure 2:
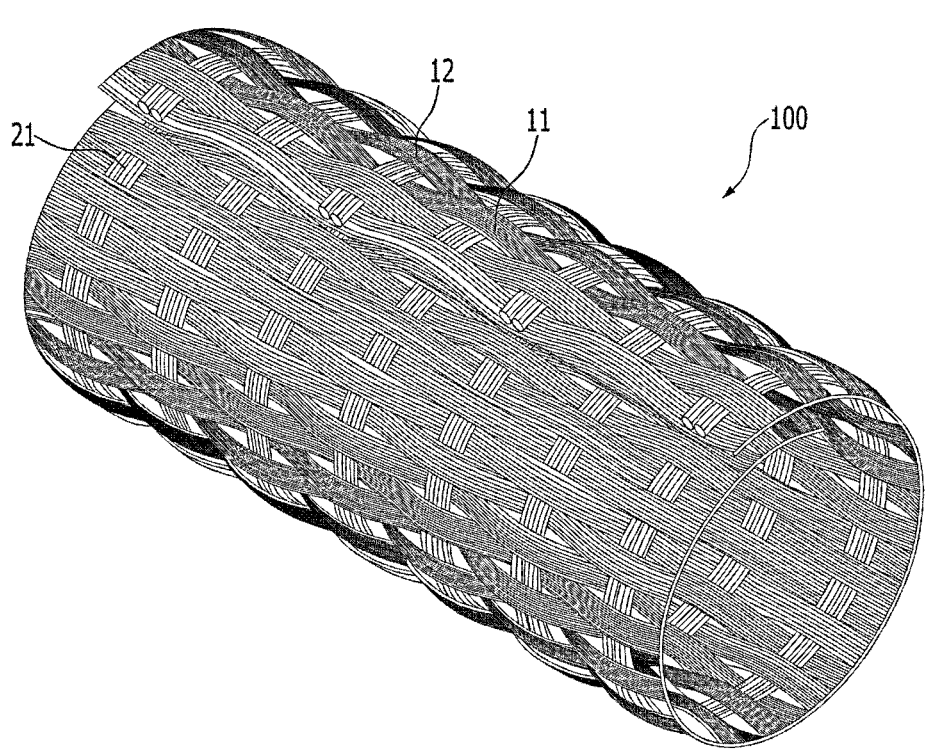
FIG. 2 is a perspective view of a composite material self-wrap shielding tube according to an embodiment of the present disclosure.
Figure 3:
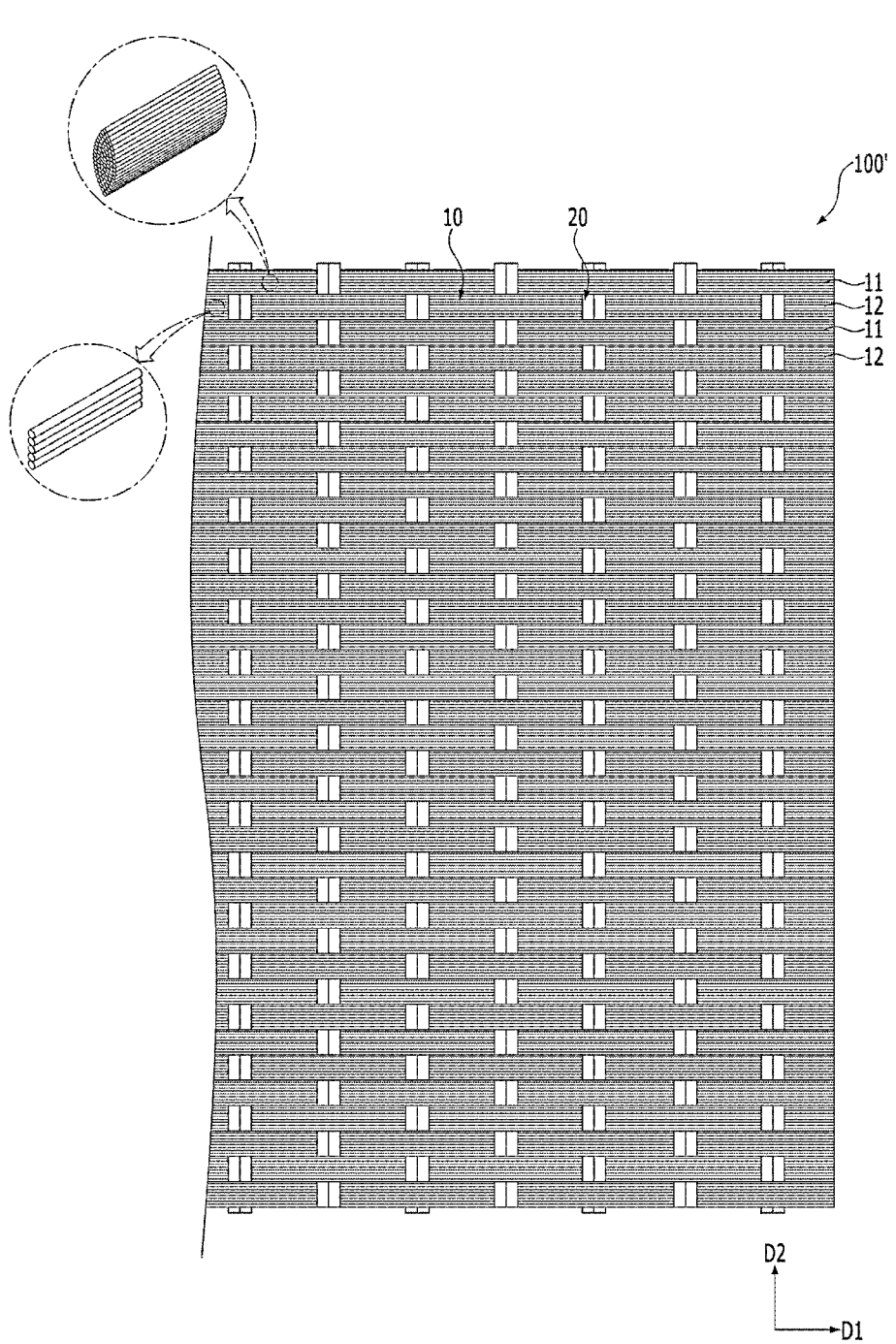
FIG. 3 is a plan view of a braided member configuring a composite material self-wrap shielding tube according to an embodiment of the present disclosure.

FIG. 2 is a perspective view of a composite material self-wrap shielding tube according to an embodiment of the present disclosure. FIG. 3 is a plan view of a braided member configuring a composite material self-wrap shielding tube according to an embodiment of the present disclosure.

Referring to FIGS. 2 and 3, a composite material self-wrap shielding tube 100 according to an embodiment of the present disclosure may be configured of a braided member 100' including: a plurality of warp yarns 10 disposed extending in a first direction D1; and a plurality of weft yarns 20 extending in a second direction D2 perpendicular to the first direction D1.

The plurality of warp yarns 10 may include a carbon fiber bundle 11 and a wire bundle 12. The carbon fiber bundle 11 and the wire bundle 12 may be disposed alternately at a predetermined ratio.

As used herein, the term "bundle" refers to a bunch or bundle of fibers composed of multiple fine fiber yarns. In the case of carbon fiber, several thousand fine carbon fiber yarns configure one bundle.

The ratio of the number of the carbon fiber bundles 11 to the number of wire bundles 12 disposed may be 1:n (where n is a natural number of 8 or less). Alternatively, the total area of the wire bundle may be 1 to 8 times the total area of the carbon fiber bundle. The arrangement of the carbon fiber bundle 11 and the wire bundle 12 will be described with reference to FIGS. 3 to 5.

The carbon fiber bundle 11 may be composed of 3 k strands, 6 k strands, or 12 k strands of carbon fiber yarn. The carbon fiber yarn may be a PAN-based carbon fiber yarn with an elongation of 1% or more.

Each of the carbon fiber yarns is coated with polyamide during a manufacturing process, which has the benefit of preventing sticking or entanglement between the carbon fiber yarns. The polyamide coating layer has good adhesion to the surface of carbon fiber and forms a film with good bending properties.

In another embodiment, the carbon fiber bundle 11 is composed of metal-plated carbon fiber yarn, and the metal plating material of the carbon fiber yarn may be copper, gold, silver, aluminum, nickel, or an alloy material thereof.

In addition, the wire bundle 12 may be disposed in the same first direction D1 as the carbon fiber bundle 11. The wire bundle 12 may be provided to improve electromagnetic wave shielding performance, which is not sufficient only with carbon fiber, and to omit separate welding processes when shrinking.

The metal wire configuring the wire bundle 12 may be a wire made of Copper Clad Aluminum (CCA).

The wire made of CCA is produced by wrapping the outside of the aluminum wire with a copper layer and welding the same to form a copper clad layer, and then is produced into a wire with an outer diameter of the desired size through a process such as wire drawing. The wire has an aluminum core inside and a copper clad layer on the outside of the core, and thus has the benefit of both copper and aluminum. The production method of the CCA wire is not limited to the aforementioned method, and various processes such as plating may be considered, but applying welding and wire drawing processes is advantageous for uniformly forming the copper clad layer.

The aluminum wire may be formed of a mixed material of silicon (Si), iron (Fe), copper (Cu), manganese (Mn), magnesium (Mg), chromium (Cr), and zinc (Zn) with aluminum (Al). The copper clad layer may be formed of oxygen-free copper with a purity of 99.9% or higher.

The wire made of CCA may have enhanced copper or aluminum properties depending on the ratio of copper to aluminum, for example, volume ratio, but depending on the diameter of the wire, the electrical conductivity required for a single wire, or the weldability of the copper clad layer, etc., the copper volume ratio of the wire made of CCA may be determined.

In another embodiment, the metal wire configuring the wire bundle 12 may be made of copper, gold, silver, aluminum, or nickel, or may be made of an alloy of copper, gold, silver, aluminum, or nickel, or may be made of copper, gold, silver, aluminum, or nickel-plated metal.

The carbon fiber bundle 11 and the wire bundle 12 may be disposed alternately at a predetermined ratio. In this embodiment, the carbon fiber bundle 11 and the wire bundle 12 may be disposed in a 1:1 ratio. For example, one carbon fiber bundle 11 is disposed, followed by one wire bundle 12, and the disposition at this ratio may be repeated.

The weft yarn 20 may be formed of shrinkable fiber yarn 21 disposed in the second direction D2 perpendicular to the first direction D1. The shrinkable fiber yarn 21 may be formed of polyolefin-based fiber yarn.

Polyolefin is a type of synthetic resin and refers to an organic material made through addition polymerization of olefins (hydrocarbons containing one double bond per molecule) such as ethylene and propylene.

Materials of polyolefin fiber yarn may include polyethylene (high-density polyethylene (HDPE), low-density polyethylene (LDPE), linear low-density polyethylene (LL-DPE)), ethylene-vinylacetate copolymer (EVA), ultra-high molecular weight PE (UHMWPE), etc. In addition, polyolefin may include various types of polypropylenes (PP), rubber/elastomer (ethylene-propylene rubber), ethylene-propylene-diene monomer (EPDM), polyolefin elastomer (POE), ethylene/octene-1, etc.

Polyolefin fiber yarn is generally elastic, insoluble in most organic solvents, resistant to acids and bases, has electrical insulation properties, and is used as a material of a general heat shrinkable tube.

The shrinkable fiber yarn 21 made of polyolefin material as described above is composed of the weft yarn 20 and is disposed in the second direction D2 of the braided member 100'.

The braided member 100' and the composite material self-wrap shielding tube 100 according to an embodiment of the present disclosure may be manufactured by braiding the carbon fiber bundles 11 composed of carbon fiber yarn and the wire bundle 12 composed of metal wires in the first direction D1 and the weft yarn 20 composed of the shrinkable fiber yarn 21 including a plurality of shrinkable materials, which are formed of a resin material and self-wrap (self-curling), i.e., are heat-shrinkable, when heated, in the second direction D2, thereby maximizing light weight and shielding performance and providing convenience when used as finishing materials.

Figure 4:
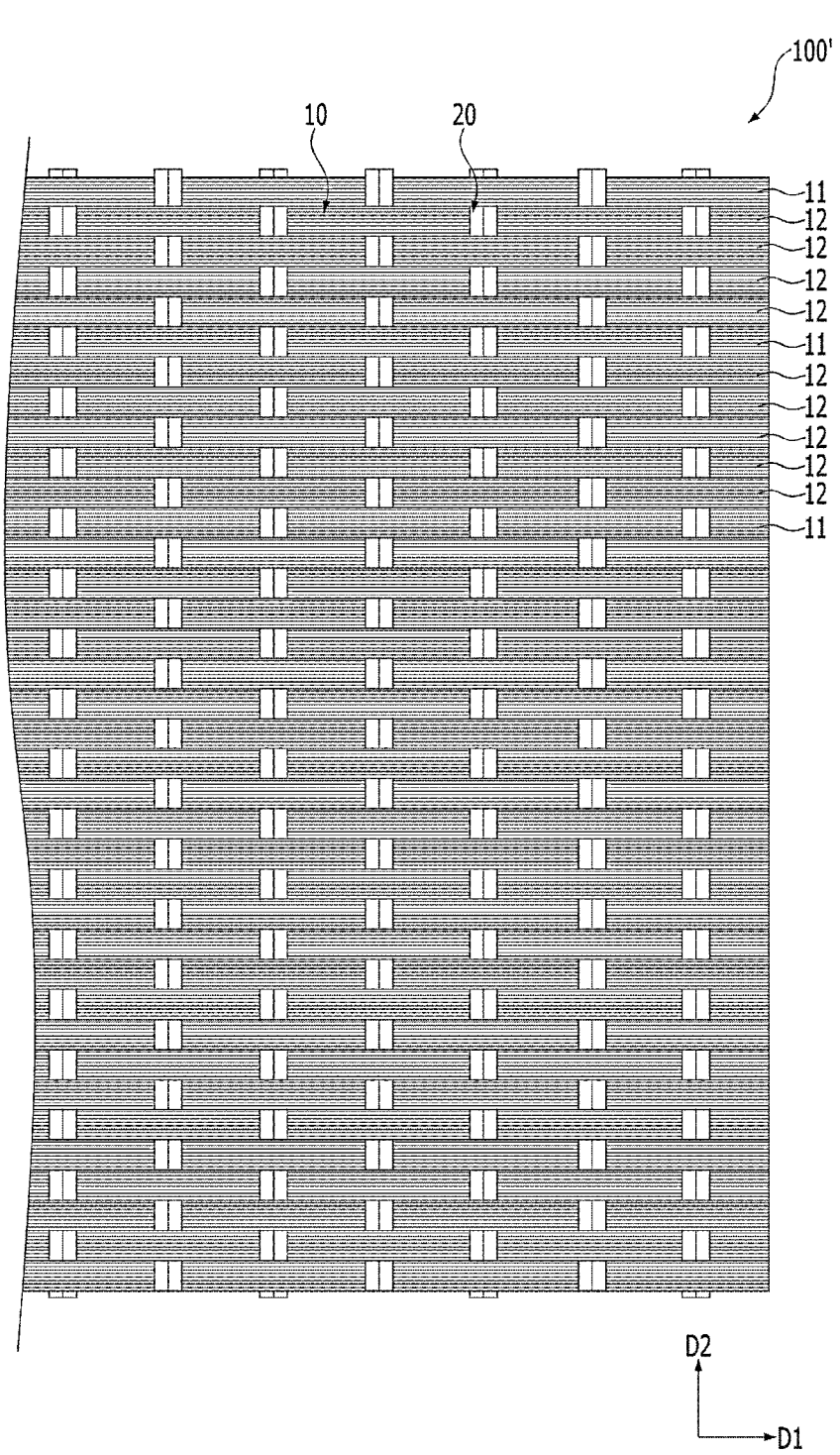
FIG. 4 is a plan view of a braided member configuring a composite material self-wrap shielding tube according to an embodiment of the present disclosure.

FIG. 4 is a plan view of a braided member configuring a composite material self-wrap shielding tube according to an embodiment of the present disclosure.

Referring to FIGS. 2 and 4, the composite material self-wrap shielding tube 100 according to an embodiment of the present disclosure may be configured of a braided member 100' including: a plurality of warp yarns 10 disposed extending in a first direction D1; and a plurality of weft yarns 20 extending in a second direction D2 perpendicular to the first direction D1.

In this embodiment, the carbon fiber bundle 11 and the wire bundle 12 may be alternately disposed with one carbon fiber bundle 11 and five wire bundles 12. In other words, during weaving, warp yarn number 1 is the carbon fiber bundle 11, warp yarn number 2 is the wire bundle 12, warp yarn number 3 is the wire bundle 12, warp yarn number 4 is the wire bundle 12, warp yarn number 5 is the wire bundle 12, and warp yarn number 6 is the wire bundle 12, and the disposition of this ratio may be performed repeatedly.

Figure 5:
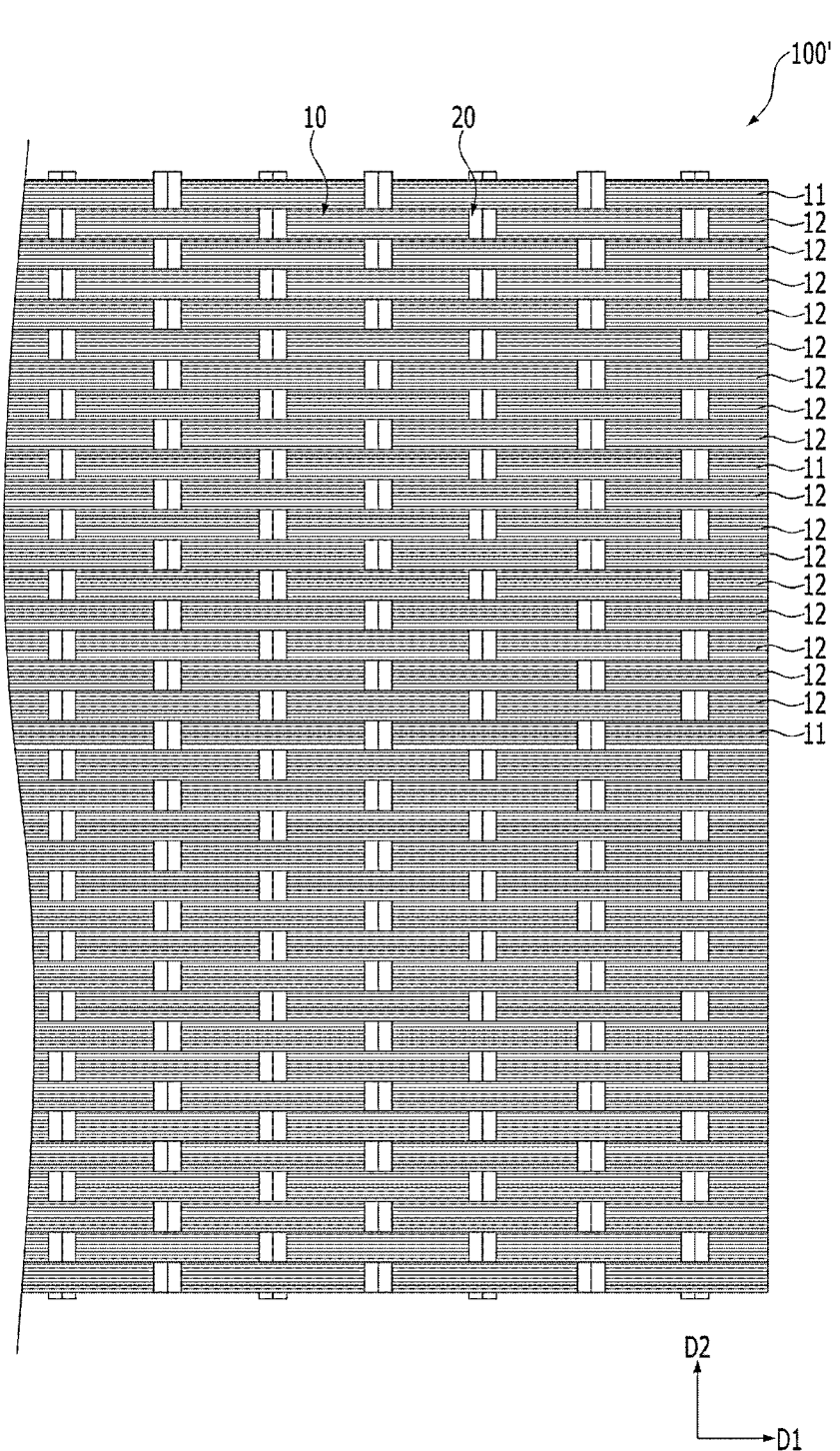
FIG. 5 is a plan view of a braided member configuring a composite material self-wrap shielding tube according to an embodiment of the present disclosure.

FIG. 5 is a plan view of a braided member configuring a composite material self-wrap shielding tube according to an embodiment of the present disclosure.

Referring to FIGS. 2 and 5, the composite material self-wrap shielding tube 100 according to an embodiment of the present disclosure may be configured of a braided member 100' including: a plurality of warp yarns 10 disposed extending in a first direction D1; and a plurality of weft yarns 20 extending in a second direction D2 perpendicular to the first direction D1.

In this embodiment, the carbon fiber bundle 11 and the wire bundle 12 may be alternately disposed with one carbon fiber bundle 11 and eight wire bundles 12. In other words, during weaving, warp yarn number 1 is the carbon fiber bundle 11, warp yarn number 2 is the wire bundle 12, warp yarn number 3 is the wire bundle 12, warp yarn number 4 is the wire bundle 12, warp yarn number 5 is the wire bundle 12, warp yarn number 6 is the wire bundle 12, warp yarn number 7 is the wire bundle 12, warp yarn number 8 is the wire bundle 12, and warp yarn number 9 is the wire bundle 12, and the disposition of this ratio may be performed repeatedly.

The ratio of the number of carbon fiber bundles 11 to the number of wire bundles 12 disposed in the composite material self-wrap shielding tube according to an embodiment of the present disclosure may be 1:n (where n is a natural number of 8 or less). However, an embodiment of the present disclosure is not limited thereto, and the ratio may vary depending on the number of strands of the carbon fiber yarn in the carbon fiber bundle.

For example, when the carbon fiber bundle is composed of 3 k strands of carbon fiber yarn, the ratio of the number of carbon fiber bundles to the number of wire bundles disposed may be 1:n (where n is a natural number of 32 or less). When the carbon fiber bundle is composed of 6 k strands of carbon fiber yarn, the ratio of the number of carbon fiber bundles to the number of wire bundles disposed may be 1:n (where n is a natural number of 16 or less). When the carbon fiber bundle is composed of 12 k strands of carbon fiber yarn, the ratio of the number of carbon fiber bundles to the number of wire bundles disposed may be 1:n (where n is a natural number of 8 or less). Alternatively, the total area of the wire bundle may be 1 to 32 times, 1 to 16 times, and 1 to 8 times the total area of the carbon fiber bundle, respectively.

Figure 6:
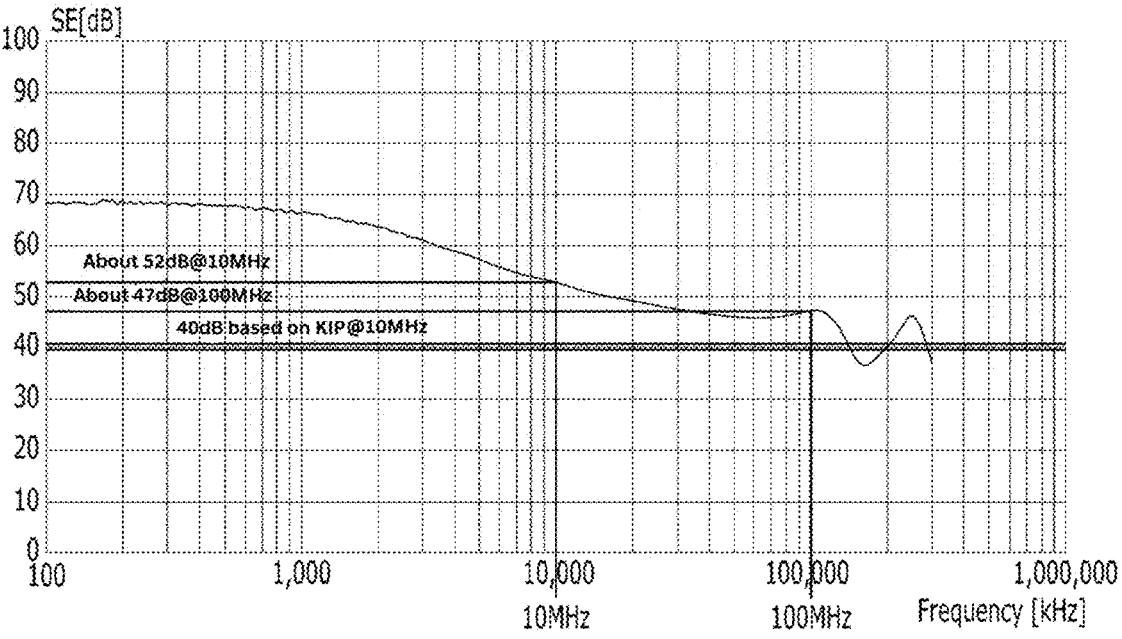
FIG. 6 is a graph showing the results of an electromagnetic shielding test of a composite material self-wrap shielding tube according to an embodiment of the present disclosure.

FIG. 6 is a graph showing the results of an electromagnetic shielding test of a composite material self-wrap shielding tube according to an embodiment of the present disclosure.

Referring to FIG. 6, the results of an electromagnetic wave shielding test of the composite material self-wrap shielding tube composed of the braided member in which one carbon fiber bundle 11 and five wire bundles 12 are alternately disposed are illustrated.

In the case of the composite material self-wrap shielding tube 100 according to an embodiment of the present disclosure, it was identified that under 1-10 MHz signal conditions, the shielding ratio SE considering the safety factor was able to secure a stable shielding ratio of 50 dB or more at 40 dB, which is the shielding ratio required for general vehicle electronics.

In addition, it was identified that the composite material self-wrap shielding tube 100 according to an embodiment of the present disclosure has a shielding ratio dB of 50 dB or more under signal conditions of 1 MHz to 10 MHz even when considering the safety factor, and furthermore, even under high-frequency signal conditions of 100 MHz (100,000 KHz), it satisfies the shielding ratio of 40 dB or more, which is required for general vehicle electronics.

Figure 7:
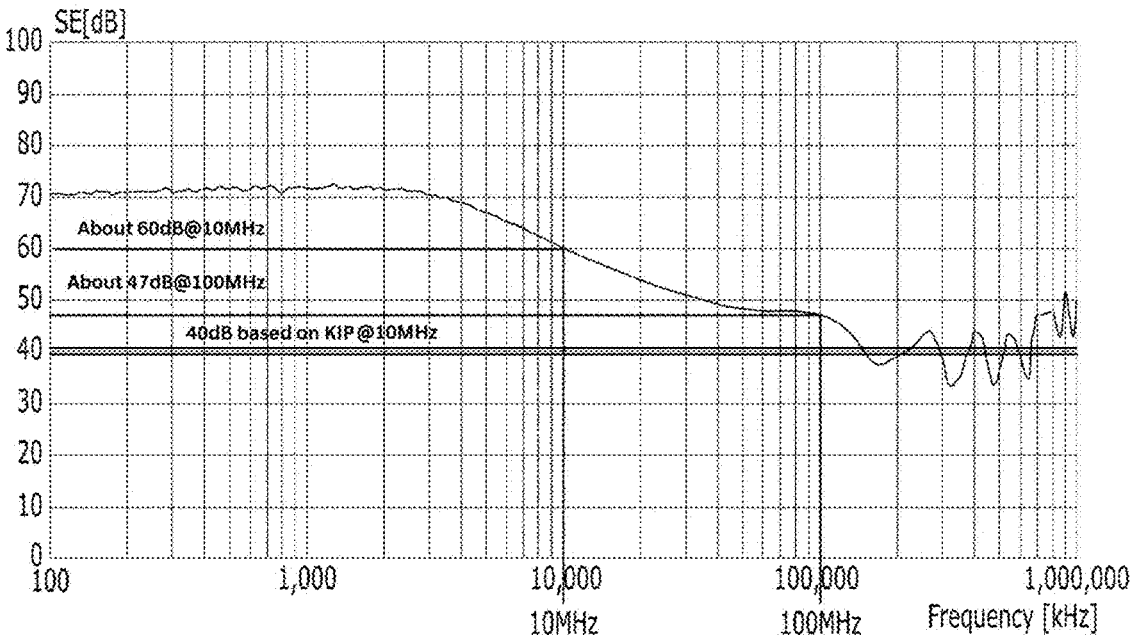
FIG. 7 is a graph showing the results of an electromagnetic wave shielding test of a composite material self-wrap shielding tube according to an embodiment of the present disclosure.

FIG. 7 is a graph showing the results of an electromagnetic wave shielding test of a composite material self-wrap shielding tube according to an embodiment of the present disclosure.

Referring to FIG. 7, the results of an electromagnetic wave shielding test of the composite material self-wrap shielding tube composed of the braided member in which one carbon fiber bundle 11 and eight wire bundles 12 are alternately disposed are illustrated.

In the case of the composite material self-wrap shielding tube 100 according to an embodiment of the present disclosure, it was identified that under 1-10 MHz signal conditions, the shielding ratio SE considering the safety factor was able to secure a stable shielding ratio of 50 dB or more at 40 dB, which is the shielding ratio required for general vehicle electronics.

In addition, it was identified that the composite material self-wrap shielding tube 100 according to an embodiment of the present disclosure has a shielding ratio dB of 50 dB or more under signal conditions of 1 MHz to 10 MHz even when considering the safety factor, and furthermore, even under high-frequency signal conditions of 100 MHz (100,000 KHz), it satisfies the shielding ratio of 40 dB or more, which is required for general vehicle electronics.

Figure 8:
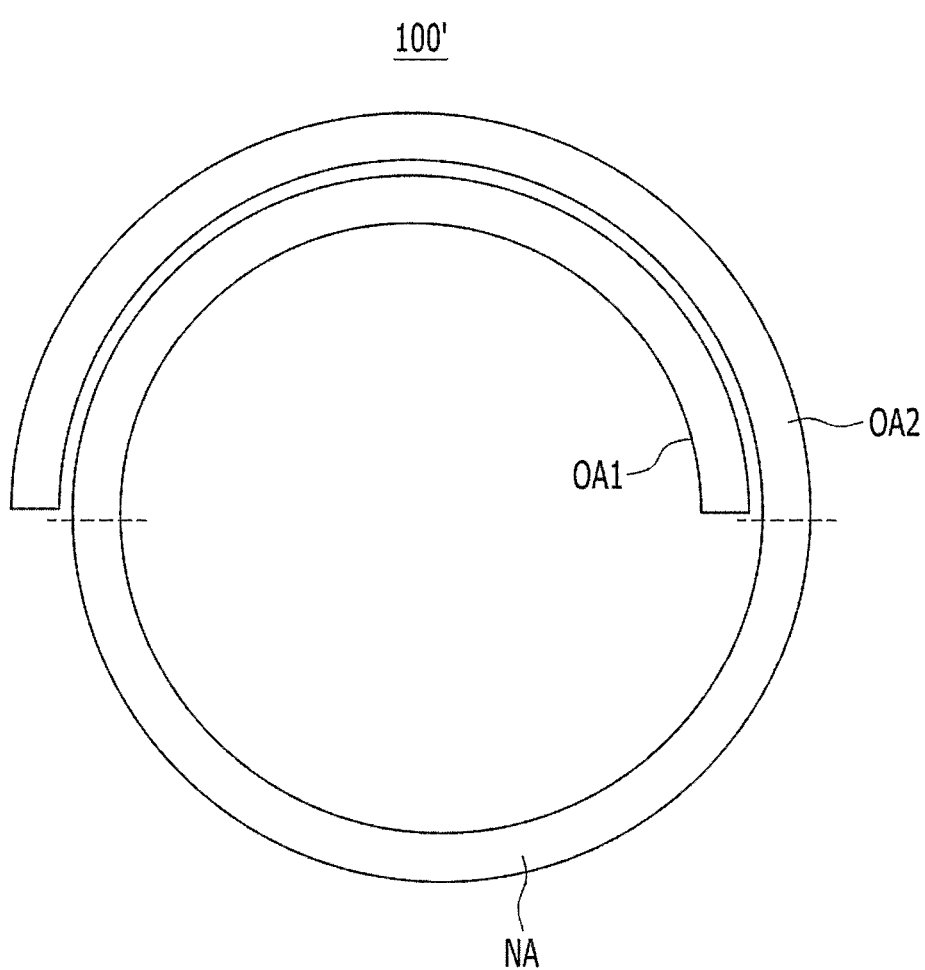
FIG. 8 is a cross-sectional view of a composite material self-wrap shielding tube according to an embodiment of the present disclosure.
Figure 9:
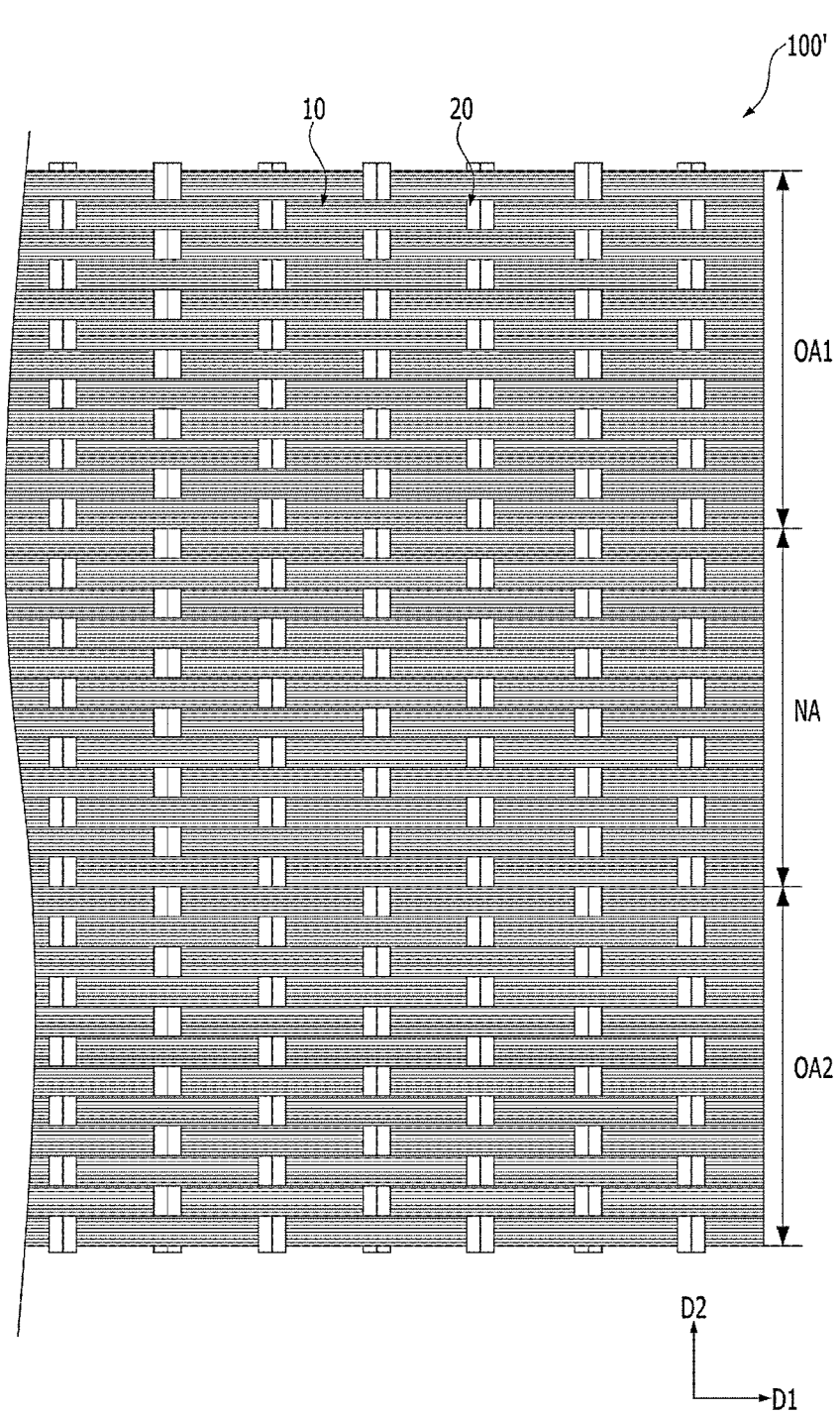
FIG. 9 is a plan view of a braided member configuring a self-wrap shielding tube according to an embodiment of the present disclosure.

FIG. 8 is a cross-sectional view of a composite material self-wrap shielding tube according to an embodiment of the present disclosure. FIG. 9 is a plan view of a braided member configuring a self-wrap shielding tube according to an embodiment of the present disclosure.

Referring to FIGS. 8 and 9, the braided member configuring the self-wrap shielding tube according to an embodiment of the present disclosure may include a first overlapping portion OA1, a second overlapping portion OA2, and a non-overlapping portion NA.

When the braided member configuring the self-wrap shielding tube is wound into a cylindrical shape, an overlapping portion may be formed where the ends of the braided member overlap in a circumferential direction of the wound braided member. The overlapping portion may include the first overlapping portion OA1 formed at a first end and the second overlapping portion OA2 formed at a second end opposite the first end. The non-overlapping portion NA may be disposed between the first overlapping portion OA1 and the second overlapping portion OA2.

The areas of the first overlapping portion OA1 and the second overlapping portion OA2 may each be ⅛ to ⅓ of the area of the braided member in the second direction. In the case of FIG. 8, the areas of the first overlapping portion OA1 and the second overlapping portion OA2 may each be ⅓ of the area in the second direction.

Figure 10:
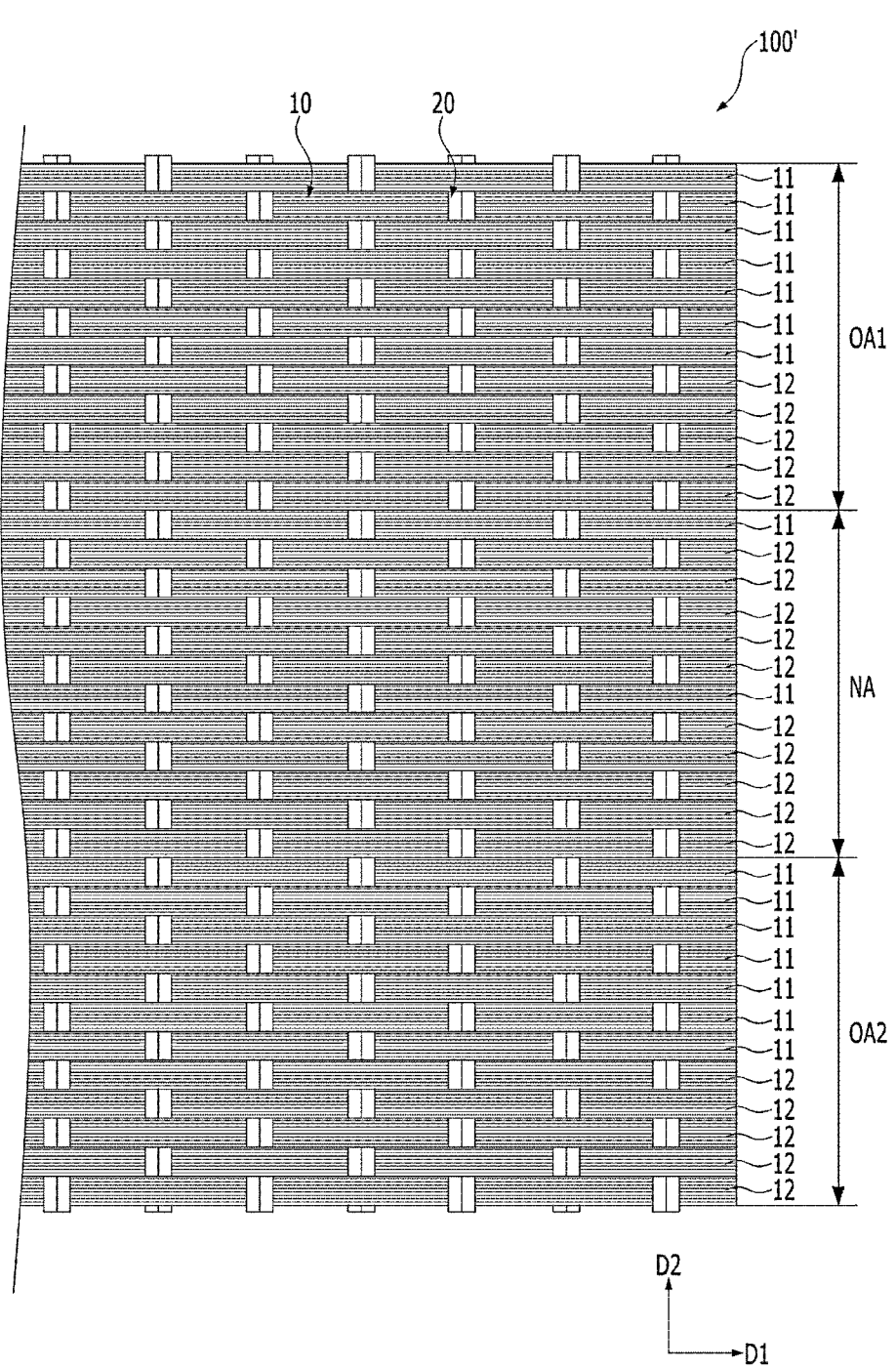
FIG. 10 is a plan view of a braided member configuring a self-wrap shielding tube according to an embodiment of the present disclosure.

FIG. 10 is a plan view of a braided member configuring a self-wrap shielding tube according to an embodiment of the present disclosure.

Referring to FIG. 10, the braided member configuring the self-wrap shielding tube according to an embodiment of the present disclosure may include an overlapping portion and a non-overlapping portion. The ratio of the number of carbon fiber bundles to the number of wire bundles disposed may be different in the overlapping portion and the non-overlapping portion.

The ratio of the number of the carbon fiber bundles to the number of wire bundles disposed in the non-overlapping portion is 1:n (where n is a natural number of 8 or less). When the carbon fiber bundle and the wire bundle in the non-overlapping portion are repeatedly disposed m times at a ratio of 1:n, the ratio of the number of the carbon fiber bundles to the number of wire bundles disposed in the first overlapping portion and the second overlapping portion may be (n+2):n, and the first overlapping portion and the second overlapping portion may be disposed by repeating the carbon fiber bundle and the wire bundle m/2 times at a ratio of (n+2):n.

For example, as shown in FIG. 10, when the ratio of the number of the carbon fiber bundles 11 to the number of wire bundles 12 disposed in the non-overlapping portion NA is 1:5 and the disposition is repeated twice at a ratio of 1:5, the ratio of the number of carbon fiber bundles 11 to the number of wire bundles 12 disposed in the first overlapping portion OA1 and the second overlapping portion OA2 may be 7:5, and the first overlapping portion OA1 and the overlapping portion OA2 may be disposed by repeating the carbon fiber bundle 11 and the wire bundle 12 once at a ratio of 7:5.

In this embodiment, the total area of the wire bundle in the first overlapping portion and the second overlapping portion may be ⅓ to ⅘ of the total area of the carbon fiber bundle.

In this embodiment, the number of wire bundles 12 disposed in the overlapping portions OA1 and OA2 may be equal to the number of wire bundles 12 disposed in the non-overlapping portion NA. Accordingly, good electromagnetic wave shielding performance can be secured and weight can be minimized.

Figure 11:
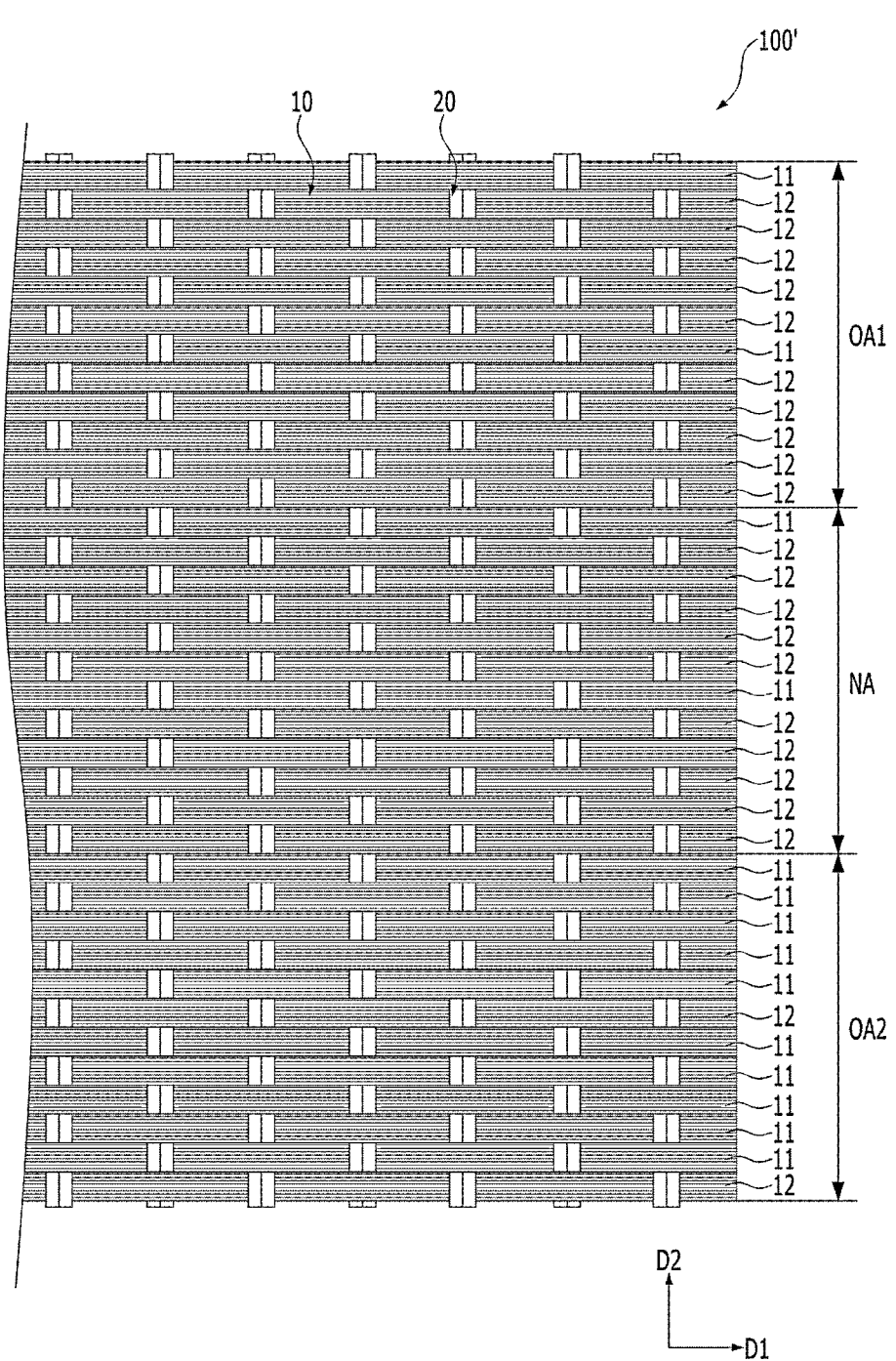
FIG. 11 is a plan view of a braided member configuring a self-wrap shielding tube according to an embodiment of the present disclosure.

FIG. 11 is a plan view of a braided member configuring a self-wrap shielding tube according to an embodiment of the present disclosure.

Referring to FIG. 11, the braided member configuring another self-wrap shielding tube according to an embodiment of the present disclosure may include an overlapping portion and a non-overlapping portion. The ratio of the number of carbon fiber bundles to the number of wire bundles disposed may be different in the overlapping portion and the non-overlapping portion.

The ratio of the number of the carbon fiber bundles 11 to the number of wire bundles 12 disposed in the non-overlapping portion NA is 1:n (where n is a natural number of 8 or less). The ratio of the number of the carbon fiber bundles 11 to the number of wire bundles 12 disposed in the first overlapping portion OA1 is 1:n (where n is a natural number of 8 or less). The ratio of the number of the carbon fiber bundles 11 to the number of wire bundles 12 disposed in the second overlapping portion OA2 is 1:n (where n is a natural number of 8 or less).

For example, as shown in FIG. 11, when the ratio of the number of the carbon fiber bundles 11 to the number of wire bundles 12 disposed in the non-overlapping portion NA is 1:5 and the disposition is repeated twice at a ratio of 1:5, the ratio of the number of carbon fiber bundles 11 to the number of wire bundles 12 disposed in the first overlapping portion OA1 and the second overlapping portion OA2 may be 1:5 and the disposition may be repeated twice at a ratio of 1:5. In addition, the ratio of the number of carbon fiber bundles 11 to the number of wire bundles 12 disposed in the second overlapping portion OA2 may be 5:1 and the disposition may be repeated twice at a ratio of 5:1.

In this embodiment, the ratio of the number of the carbon fiber bundles 11 to the number of wire bundles 12 disposed in the first overlapping portion OA1 and the non-overlapping portion NA may be the same, and the ratio of the number of carbon fiber bundles 11 to the number of wire bundles 12 disposed in the second overlapping portion OA2 may be such that the ratio of carbon fiber is high.

In addition, in another embodiment, the carbon fiber bundle 11 disposed in the second overlapping portion OA2 may be replaced with a non-conductive material. For example, a multifilament material made of aramid or polyester may be used instead of the carbon fiber bundle 11.

In addition, in this embodiment, the first overlapping portion OA1 and the second overlapping portion OA2 are described as being formed with the same area, but the present disclosure is not limited thereto, and the second overlapping portion OA2 may be formed with a smaller area than the first overlapping portion OA1. For example, the ratio of the number of carbon fiber bundles 11 to the number of wire bundles 12 disposed in the first overlapping portion OA1 may be 1:5, and the disposition may be repeated twice at a ratio of 1:5. In addition, the number of the carbon fiber bundles 11 and the wire bundles 12 disposed in the second overlapping portion OA2 may be disposed once at a ratio of 5:1 or once at a ratio of 4:1 or less.

In this embodiment, the first overlapping portion OA1 and the non-overlapping portion NA have an appropriate number of wire bundles disposed to ensure good electromagnetic wave shielding performance. The second overlapping portion OA2 is a portion disposed on the outside when overlapping, and can improve workability of cable shielding work and reduce weight by disposing the number of carbon fiber bundles to be greater than the number of wire bundles. In addition, in another embodiment, manufacturing costs can be reduced by using a non-conductive material instead of a carbon fiber bundle.

While the present disclosure has been described above with respect to exemplary embodiments thereof, it would be understood by those of ordinary skilled in the art that various changes and modifications may be made without departing from the technical conception and scope of the present disclosure defined in the following claims.

What is claimed is:

1. A composite material self-wrap shielding tube, comprising:
   a plurality of carbon fiber bundles disposed extending in a first direction;

a plurality of wire bundles extending in the first direction parallel to the carbon fiber bundles and alternately disposed therewith, and composed of metal wires; and
   a plurality of weft yarns disposed extending in a second direction perpendicular to the first direction,
   wherein the composite material self-wrap shielding tube is formed by winding, into a cylindrical shape, a braided member made by braiding the carbon fiber bundles, the wire bundles, and the weft yarns,
   wherein, when the braided member is wound into a cylindrical shape, an overlapping portion is formed where ends of the braided member overlap in a circumferential direction of the cylindrically wound braided member,
   wherein, the overlapping portion comprises a first overlapping portion formed at a first end and a second overlapping portion formed at a second end opposite the first end, and
   wherein areas of the first overlapping portion and the second overlapping portion each are ⅛ to ⅓ of an area of the braided member in the second direction.

2. The composite material self-wrap shielding tube of claim 1, wherein a ratio of the number of the carbon fiber bundles to the number wire bundles disposed is 1:n (where n is a natural number of 8 or less).

3. The composite material self-wrap shielding tube of claim 1, wherein a total area of the wire bundle is 1 to 8 times a total area of the carbon fiber bundle.

4. The composite material self-wrap shielding tube of claim 1, wherein the carbon fiber bundle is composed of 3 k strands, 6 k strands, or 12 k strands of carbon fiber yarn.

5. The composite material self-wrap shielding tube of claim 4, wherein the carbon fiber yarn configuring the carbon fiber bundle is coated with polyamide.

6. The composite material self-wrap shielding tube of claim 1, wherein a metal wire configuring the wire bundle is made of CCA (Copper Clad Aluminum).

7. The composite material self-wrap shielding tube of claim 6, wherein the metal wire configuring the wire bundle is formed of a mixed material of silicon (Si), iron (Fe), copper (Cu), manganese (Mn), magnesium (Mg), chromium (Cr), and zinc (Zn) with aluminum (Al).

8. The composite material self-wrap shielding tube of claim 1, wherein the composite material self-wrap shielding tube has a shielding ratio (dB) of 40 dB or more under a signal condition of 100 MHz.

9. The composite material self-wrap shielding tube of claim 1, wherein:
   a ratio of the number of the carbon fiber bundles to the number of wire bundles disposed is 1:n (where n is a natural number of 32 or less); and
   the carbon fiber bundle is configured of 3 k strands of carbon fiber yarn.

10. The composite material self-wrap shielding tube of claim 1, wherein:
   a ratio of the number of the carbon fiber bundles to the number of wire bundles disposed is 1:n (where n is a natural number of 16 or less); and
   the carbon fiber bundle is configured of 6 k strands of carbon fiber yarn.

11. The composite material self-wrap shielding tube of claim 1, wherein:
   a ratio of the number of the carbon fiber bundles to the number of wire bundles disposed is 1:n (where n is a natural number of 8 or less); and
   the carbon fiber bundle is configured of 12 k strands of carbon fiber yarn.

12. The composite material self-wrap shielding tube of claim 1, wherein, in the first overlapping portion and the second overlapping portion, a total area of the wire bundle is ⅓ to ⅘ of a total area of the carbon fiber bundle.

13. The composite material self-wrap shielding tube of claim 1, wherein the braided member comprises a non-overlapping portion disposed between the first overlapping portion and the second overlapping portion, wherein:

a ratio of the number of the carbon fiber bundles to the number of wire bundles disposed in the non-over-lapping portion is 1:n (where n is a natural number of 8 or less); and when the carbon fiber bundle and the wire bundle in the non-overlapping portion are repeatedly disposed m times at a ratio of 1:n, a ratio of the number of the carbon fiber bundles to the number of wire bundles disposed in the first overlapping portion and the second overlapping portion is (n+2):n, and the first overlapping portion and the second overlapping portion is disposed by repeating the carbon fiber bundle and the wire bundle m/2 times at a ratio of (n+2):n.

14. The composite material self-wrap shielding tube of claim 1, wherein the braided member comprises a non-overlapping portion disposed between the first overlapping portion and the second overlapping portion, wherein:

a ratio of the number of the carbon fiber bundles to the number of wire bundles disposed in the non-over-lapping portion is 1:n (where n is a natural number of 8 or less);

a ratio of the number of the carbon fiber bundles to the number of wire bundles disposed in the first over-lapping portion is 1:n (where n is a natural number of 8 or less); and a ratio of the number of the carbon fiber bundles to the number of wire bundles disposed in the second overlapping portion is 1:n (where n is a natural number of 8 or less).

15. A cable wrapped by the composite material self-wrap shielding tube according to claim 1.

* * * * *